United States Patent [19]
Burroughes et al.

[11] Patent Number: 5,162,891
[45] Date of Patent: Nov. 10, 1992

[54] GROUP III-V HETEROSTRUCTURE DEVICES HAVING SELF-ALIGNED GRADED CONTACT DIFFUSION REGIONS AND METHOD FOR FABRICATING SAME

[75] Inventors: Jeremy H. Burroughes, Cambridgeshire, England; Mark S. Milshtein, Ossining, N.Y.; Michael A. Tischler, Croton-on-Hudson, N.Y.; Sandip Tiwari, Ossining, N.Y.; Steven L. Wright, Peekskill, N.Y.

[73] Assignee: International Business Machines Corporation, Armonk, N.Y.

[21] Appl. No.: 725,589

[22] Filed: Jul. 3, 1991

[51] Int. Cl.[5] .................. H01L 29/12; H01L 29/167; H01L 29/161; H01L 27/14
[52] U.S. Cl. .................. 257/183; 257/185; 257/191; 257/458; 257/609
[58] Field of Search .............. 357/58, 63, 67, 16, 357/30

[56] References Cited

U.S. PATENT DOCUMENTS

| | | | |
|---|---|---|---|
| 4,540,446 | 9/1985 | Nonaka et al. | 357/65 |
| 4,593,307 | 6/1986 | Rupprecht et al. | 357/67 |
| 4,843,033 | 6/1989 | Plumton et al. | 357/67 |
| 5,027,187 | 6/1991 | O'Mara, Jr. et al. | 357/65 |
| 5,032,884 | 7/1991 | Yamagishi et al. | 357/58 |

Primary Examiner—Mark V. Prenty
Attorney, Agent, or Firm—Scully, Scott, Murphy & Presser

[57] ABSTRACT

A lateral injection group III-V heterostructure device having self-aligned graded contact diffusion regions of opposite conductivity types and a method of fabricating such devices are disclosed. The device includes a heterojunction formed by a higher bandgap III-V compound semiconductor formed over a lower bandgap III-V compound semiconductor. The method of the present invention allows the opposite conductivity type diffusion regions to diffuse simultaneously and penetrate the heterojunction. This results in compositional mixing of the compound semiconductor materials forming the heterojunction in the diffusion regions.

9 Claims, 2 Drawing Sheets

GROUP III-V HETEROSTRUCTURE DEVICES HAVING SELF-ALIGNED GRADED CONTACT DIFFUSION REGIONS AND METHOD FOR FABRICATING SAME

BACKGROUND OF THE INVENTION

1. Field of the Invention

The present invention relates generally to Group III-V lateral injection heterostructure devices, and more particularly, to a lateral p-i-n photodetector having doped self-aligned graded contact diffusion regions of opposite conductivity types which penetrate an abrupt heterojunction formed by the upper two layers and a method for manufacturing same.

2. Description of the Prior Art

For both majority and minority carrier lateral injection heterostructure devices, it is desired to have regions where an abrupt heterojunction is maintained and regions where it is compositionally graded. Examples of devices where this is of use are optical devices such as photodetectors and lasers and electronic devices such as metal-semiconductor field effect transistors, heterostructure metal-semiconductor field effect transistors and heterostructure field effect transistors. In such devices, the abrupt heterojunction is necessary in regions where it is desired to prevent carriers from reaching the surface of the device to reduce the leakage current. The graded region is desired where either injection or collection of carriers is required to occur which is generally associated with doped contact diffusion regions. A graded region is desired in a doped contact diffusion region because it will increase the speed of the device due to carriers being efficiently collected or injected by the graded diffusion regions. In order to fabricate a graded contact diffusion region in such heterostructure devices, the diffusion region must penetrate a type I Group III-V compound semiconductor heterojunction in which the higher bandgap III-V compound semiconductor has its conduction band higher and valence band lower than the corresponding conduction and valence band in the lower bandgap III-V compound semiconductor. Due to a requirement of high carrier lifetimes, small size and high quality ohmic contacts in such devices, ion implantation techniques are not suitable for forming contact regions in Group III-V heterostructure devices. In addition, ion implantation followed by annealing does not lead to grading of heterostructures.

Various ohmic contacts which can be used to form diffusion regions in Group III-V compound semiconductors have been developed. For example, U.S. Pat. No. 4,593,307 is directed to the formation of a molybdenum germanide contact to n-type gallium arsenide. U.S. Pat. No. No. 4,540,446 shows an n-type contact diffusion region formed by ion implantation of an n-type dopant into a germanium film and a subsequent heating step diffuses the dopant into a gallium arsenide substrate. An article by Tiwari, S., et al., entitled "Ohmic Contacts to N-GaAs with Germanide Overlayers", *Tech. Dig. of IEDM*, 115 (Dec. 1983) shows an ohmic contact to n-GaAs which uses germanium as the diffusing dopant impurity and molybdenum germanide as a contacting metallurgy.

U.S. Pat. No. No. 4,843,033 relates to a method for diffusing zinc into Group III-V heterojunctions having layers of a small bandgap semiconductor material (GaAs) formed over a layer of a larger bandgap semiconductor material (AlGaAs). Zinc tungsten silicide ($ZnWSi_2$) is used as a contact and dopant source. During a rapid thermal anneal, the zinc is diffused through two layers of doped GaAs to contact an n-doped layer of AlGaAs. Carriers are free to combine at the surface because the wide bandgap material AlGaAs is below the narrow bandgap material GaAs.

Thus, there is a need to develop a lateral injection Group III-V heterostructure having graded contact diffusion regions which penetrate a heterojunction formed by a layer of a high bandgap III-V compound semiconductor overlying a layer of a low bandgap III-V compound semiconductor and a method for manufacturing such heterostructures.

SUMMARY OF THE INVENTION

The present invention is directed to lateral injection Group III-V heterostructures having self-aligned graded diffusion regions and a method for fabricating same. The method of the present invention involves forming an undoped intrinsic layer of a Group III-V semiconductor compound on a Group III-V compound substrate. An upper layer of a Group III-V semiconductor compound having a wider bandgap energy than the intrinsic layer is then formed on the intrinsic layer. The upper layer and the intrinsic layer form an abrupt Type I heterojunction. Both layers can be formed by well known epitaxial techniques such as molecular beam epitaxy (MBE) or metal-organic chemical vapor deposition (MOCVD). A nitride layer is then deposited on the three layer Group III-V heterostructure. The nitride layer is patterned by conventional techniques to form first contact regions. Next, a first contact material which contains a dopant of a first conductivity type is deposited in the first contact regions. Second contact regions are then formed by the same conventional techniques used to form the first contact regions. A second contact material which contains a dopant of a second conductivity type is deposited in the second contact regions. The structure is then subjected to a rapid thermal anneal during which both dopants simultaneously diffuse into the upper layer and penetrate the intrinsic layer to form doped graded diffusion regions of opposite conductivity types.

The use of a wider bandgap upper layer on top of the lower bandgap intrinsic layer reduces recombination of both electrons and holes and leads to larger built-in voltages. This results in a low leakage current. The compositional mixing of the heterointerface in the diffusion regions allows electrons and holes to be collected efficiently which results in a fast response of the device, a large bandwidth at low bias conditions, a large responsivity with a large dynamic range, and substantially reduces the long time constant tails in the temporal response and the low-frequency gain. The use of diffusion not only maintains a large carrier lifetime but also allows for a self-aligned structure with a corresponding simplification in the fabrication process.

DETAILED DESCRIPTION OF THE INVENTION

Figure 1:
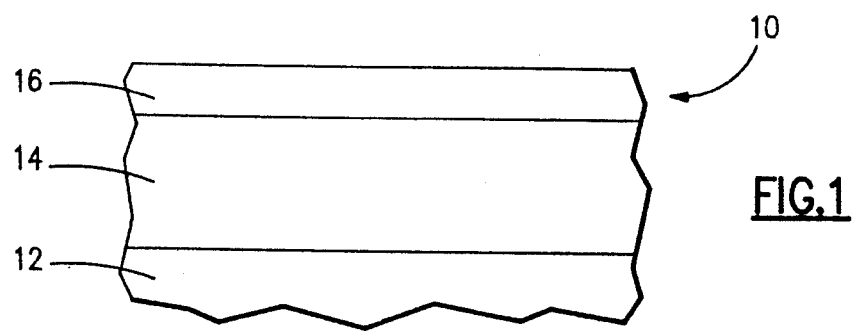
FIGS. 1-3 are cross-sectional views disclosing the fabrication of the Group III-V lateral p-i-n heterojunction structure of the present invention at successive stages in accordance with the method of the present invention.

In accordance with the present invention, a lateral p-i-n photodetector is formed using a self-aligned graded contact diffusion process. Referring to the drawings, FIGS. 1-3 will be described in connection with the various steps of fabrication of the p-i-n photodetector of the present invention. While the method of the present invention will be described in connection with forming a p-i-n photodetector, it should be understood that the features of the present invention may be adapted for other lateral injection heterostructures where it is desired to have regions where an abrupt heterointerface is maintained and regions where the heterointerface is graded. Examples of such lateral injection heterostructures are optical devices such as lasers and electronic devices such as field effect transistors. It should also be understood by those skilled in the art that various conventional processes relating to applying, exposing and developing photoresist materials to form desired patterns for masking layers are not specifically described herein but are well known in the art. The present invention also contemplates the use of well known etching techniques such as reactive ion etching and plasma etching. In addition, the present invention contemplates the use of deposition techniques such as molecular beam epitaxy (MBE), metal-organic chemical vapor deposition (MOCVD) and plasma enchanced CVD (PECVD) that are also well known in the art and are not specifically described herein.

Turning now to the drawings, FIG. 1 is a cross-sectional view of a Group III-V heterostructure 10 to which the method of the present invention can be applied. There is shown a semi-insulating substrate 12 of a first Group III-V compound semiconductor. An undoped intrinsic layer 14 of a second Group III-V semiconductor is sandwiched between the substrate 12 and an undoped upper layer 16 of a third Group III-V semiconductor compound. Layers 14 and 16 can be grown by either MBE or MOCVD or any other well known epitaxial technique. The intrinsic layer 14 may be in the range 1 to 3 $\mu$m thick and upper layer 14 may be in the range of 200 to 500 Angstroms thick. In one embodiment of the present invention the substrate 12, intrinsic layer 14 and upper 16 were comprised of GaAs, GaAs and $Ga_{0.7}Al_{0.3}As$ respectively. In another embodiment of the present invention the substrate 12, intrinsic layer 14 and upper layer 16 were comprised of InP, $Ga_{0.48}In_{0.52}As$ and $Al_{0.53}In_{0.47}As$ respectively.

Figure 2:
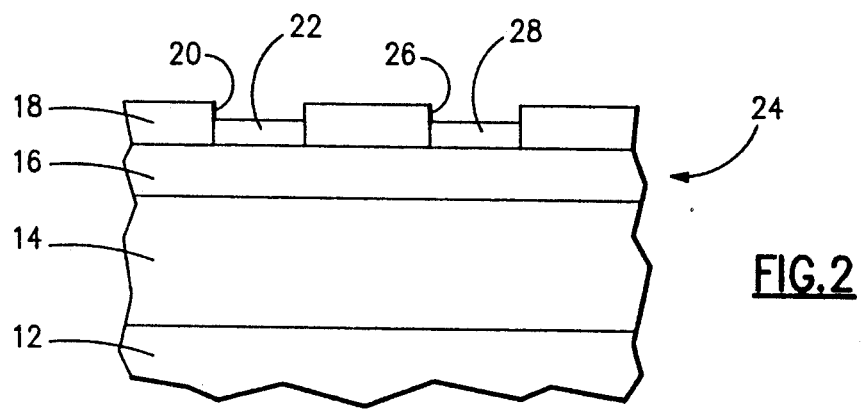

As shown in FIG. 2, the next step is to deposit a nitride layer 18 on upper layer 16 by plasma enhanced chemical vapor deposition (PECVD), or any other suitable technique. Layer 18 has a thickness typically in the range of 500 to 2,000 Angstroms. A suitable nitride for layer 18 is silicon nitride.

Next, conventional photolithographic patterning and masking techniques are used to define a contact line 20. The nitride layer 18 is then etched typically by reactive ion etching (RIE) to form contact line 20. A first contact material 22 is then deposited in contact line 20 by sputtering or any other suitable technique. The patterned photoresist used to define line 20 is then lifted off. The thickness of the deposited contact material 22 is in the range of 500 to 2,500 Angstroms. The first contact material includes a dopant of a first conductivity type and a contact metal.

In the next step in accordance with the method of the present invention, conventional photolithographic patterning and masking techniques are used to define contact line 26. The nitride 18 is first etched by RIE to form contact line 26. Then a second contact material 28 is deposited in contact line 26 by sputtering or any other suitable technique. The patterned photoresist used to define line 26 is then lifted off. The deposited contact material 28 has a thickness in the range of 500 to 2,500 Angstroms. The second contact material includes a dopant of a second conductivity type and a metal.

Contact materials suitable for use in either of the above embodiments of the present invention include $MoGe_2$ and Zn doped tungsten (W(Zn)) having a zinc concentration of between 1 and 5 percent. W(Zn) is used to form p-type contacts and p-type diffusion regions while $MoGe_2$ is used to form n-type contacts and n-type diffusion regions. Tungsten zinc silicide ($WZnSi_2$) is also a suitable contact material.

The structure is then subjected to a rapid thermal anneal to simultaneously diffuse some of the dopants out of the first and second contact films respectively, and penetrate the heterojunction 32 to form diffusion regions 34 and 36 respectively. The diffusion regions are heavily doped with said dopants and are of opposite conductivity types. The use of W(Zn) and $MoGe_2$ as first and second contact materials results in a p+ diffusion region 34 and an n+ diffusion region 36 respectively. The nitride layer 18 is used as a diffusion mask during the annealing. The rapid thermal anneal should be performed with a temperature range from 650° C. and 750° C. and within a time period ranging from 1 to 300 seconds. It is preferred that the annealing be carried out at 700° C. for 30 seconds.

The diffusion of Zn and Ge involves Group III lattice sites and hence results in a compositional mixing of the Group III-V compound semiconductor of the upper layer 16 and intrinsic layer 14 in the diffusions regions 34 and 36. This results in a removal of the abrupt heterojunction 32 in the diffusion regions 34 and 36. Thus, the diffusion regions 34 and 36 are graded. The layer distinctions between layer 16 and 14 in the diffusion regions 34 and 36 are thus irrelevant and a dotted line is used only to show where the abrupt heterointerface used to be.

It is preferred that the thickness of diffusion regions 34 and 36 be twice that of the upper layer 16 to insure that the diffusion regions 34 and 36 penetrate the heterojunction 32. Since the thickness of layer 16 is typically between 300 and 500 Angstroms, the thickness of the diffusion regions 34 and 36 range from 600 to 1,000 Angstroms. The spacing between the graded diffusion regions 34 and 36 which are also referred to as "fingers", is typically in the range of 0.5 to 10 μm. The doping concentration in diffusion regions 34 and 36 is typically in the range of $10^{18}$ to $10^{19}$ cm$^{-3}$ or greater.

Figure 3:
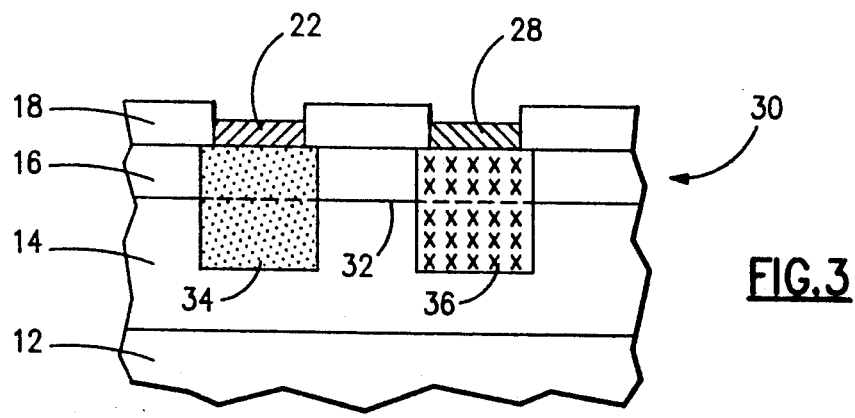
Figure 4:
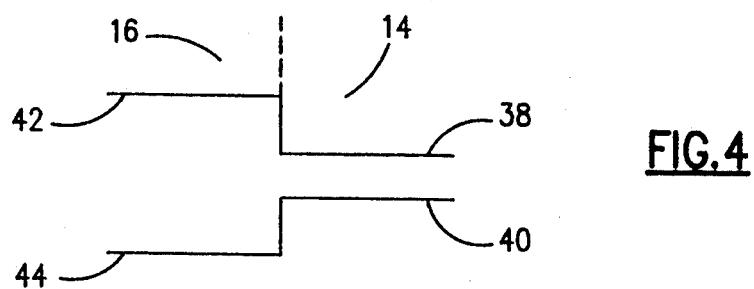
FIG. 4 is an energy band diagram of the structure of FIG. 3 in regions where diffusion has not occurred.

Referring now to FIG. 4, there is shown an energy band diagram of layers 14 and 16 of the photodetector of FIG. 3 in the regions between diffusion regions 34 and 36. The band arrangement of the second Group III-V compound semiconductor consists of conduction band edge 38 and valence band edge 40 spaced apart by a corresponding bandgap. The band arrangement of the third Group III-V compound semiconductor consists of conduction band edge 42 and valence band edge 44 spaced apart by a corresponding bandgap. The bandgap energy of the third III-V compound semiconductor is higher than the bandgap energy of the second III-V compound semiconductor. In addition, the band alignment between these two layers is a Type I alignment, namely, the band edges 38 and 40 of the smaller bandgap material are nested within the band edges 42 and 44 of the larger bandgap material as shown in FIG. 4.

Figure 5:
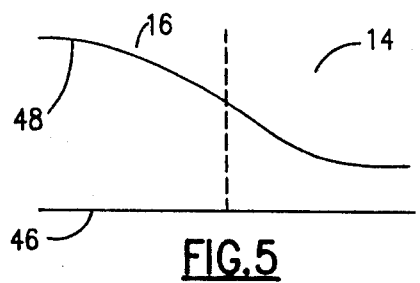
FIG. 5 is an energy band diagram of the diffusion region of FIG. 3 doped with a p-type dopant.

FIG. 5 shows the energy band diagram of the graded diffusion region 34 doped with a p-type dopant. Since region 34 is heavily p-doped, the high hole conductivity of this layer ensures that the valence band 46 is effectively flat. Due to the compositional mixing in diffusion region 34, there is a gradual change in the conduction band 48. The graded diffusion region 34 allows holes to be collected efficiently by the p-type diffusion region 34.

Figure 6:
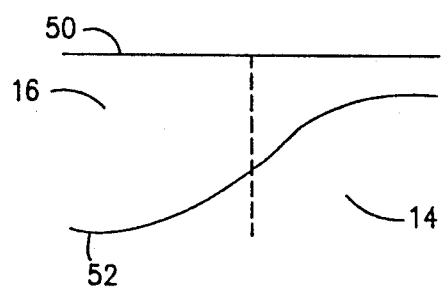
FIG. 6 is an energy band diagram of the diffusion region of FIG. 3 doped with an n-type dopant.

Similarly, FIG. 6 shows the energy band diagram of the graded diffusion region 36 doped with an n-type dopant. Since region 36 is heavily n-doped, the high electron conductivity of this layer ensures that the conduction band 50 is effectively flat. Since the n-type diffusion region 36 is graded, there is a gradual change in the valence band 52. The graded diffusion region 36 allows electrons to be collected efficiently by the n-type diffusion region 36.

The lateral p-i-n photodetector of FIG. 3 is analyzed in FIGS. 7 to 10. The analyzed photodetector was comprised of a semi-insulating InP substrate, a $Ga_{0.48}In_{0.52}As$ intrinsic layer and an $Al_{0.53}In_{0.47}As$ upper layer. W(Zn) was used for p-type contacts and graded diffusion regions and $MoGe_2$ was used for n-type contacts and graded diffusion regions.

Figure 7:
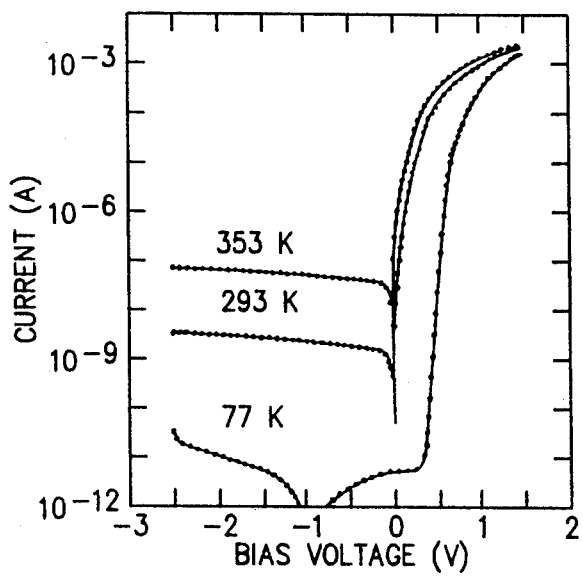
FIG. 7 is a graph showing the current v. voltage characteristic of the photodetector of FIG. 3 wherein the substrate, intrinsic layer and upper layer are comprised of InP, $Ga_{0.48}In_{0.52}As$ and $Al_{0.53}In_{0.47}As$ respectively.

FIG. 7 shows the current v. voltage characteristic of the $Ga_{0.48}In_{0.52}As$ photodetector. As shown in FIG. 7 the $Ga_{0.48}In_{0.52}As$ photodetector has a low reverse leakage current. The low reverse leakage current is due to the use of a wide bandgap Group III-V semiconductor overlying a small bandgap Group III-V semiconductor which prevents surface recombination of carriers.

Figure 8:
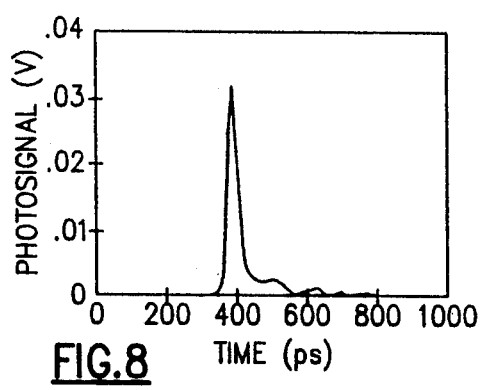
FIG. 8 is a graph showing the temporal response of the $Ga_{0.48}In_{0.52}AS$ photodetector of FIG. 7.

FIG. 8 is a graph showing the temporal response of the $Ga_{0.48}In_{0.52}As$ photodetector with FWHM ranges between 31 and 35 ps for 3 to 6 V bias. The extracted bandwidth (BW) exceeded 18.0 GHz. The short long time constant tail due to compositional mixing in the diffusion regions can readily be seen from this figure.

Figure 9:
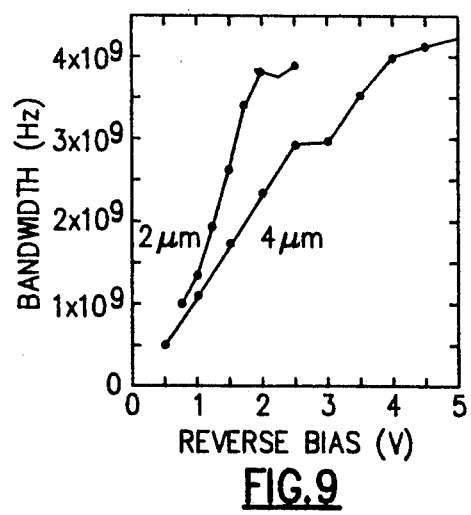
FIG. 9 is a graph showing the bias dependence of the $Ga_{0.48}In_{0.52}As$ photodetector of FIG. 7.

FIG. 9 is a graph of the bias dependence of the $Ga_{0.48}In_{0.52}As$ photodetector. A direct bandwidth measurement as a function of bias was performed for two different finger spacings, 2 μm and 4 μm. The power level was held constant at 100 μW. This figure shows that the photodetector can be operated over a large bandwidth at low bias conditions. This is a result of the compositional mixing of the abrupt heterojunction in the diffusion regions and the larger built in electric fields of p-i-n structures.

Figure 10:
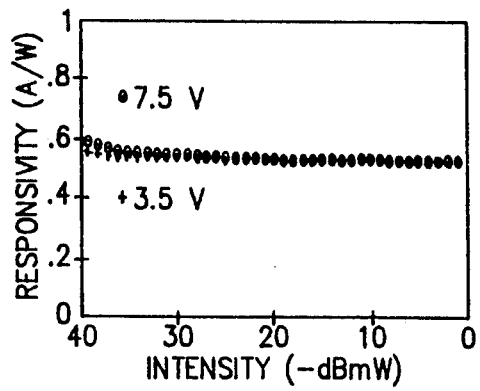
FIG. 10 is a graph showing the responsivity of the $Ga_{0.48}In_{0.52}As$ photodetector of FIG. 7 at two applied voltages.

FIG. 10 is a graph of the responsivity of the $Ga_{0.48}In_{0.52}As$ photodetector in Amps per Watt (A/W) as a function of light intensity for two different bias voltages. The graded diffusion regions result in a large dynamic range of the responsivity as shown in FIG. 10. In particular, the responsivity is unchanged from −35 dBmW to 0 dBmW of input power.

In summary, the present invention results in a lateral p-i-n photodetector where electrons and holes are collected efficiently due to the graded diffusion regions. This results in a fast response, a reduced long time constant in the temporal response, a large bandwidth at low bias conditions and a large responsivity with a large dynamic range. In addition, the use of a higher bandgap III-V compound semiconductor disposed on a lower bandgap III-V compound semiconductor prevents recombination of carriers by acting as an effective barrier to such carriers and leads to larger built-in voltages. This results in a low leakage current. Transport in the photodetector of the present invention is dominated by bulk effects with life times exceeding a microsecond. Bandwidths exceeding 18 GHz have been obtained for the $Ga_{0.48}In_{0.52}As$ photodetector. For bias voltages in the 3 to 5 V range, the bandwidths are well above 5 GHz. These voltages are now compatible with power supply voltages of digital circuits. In addition, photodetectors formed by the present invention utilize material structures that are compatible with heterostructure based FET technologies, thus, making growth redundant.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. A lateral p-i-n heterojunction device comprising:
a substrate of a first Group III-V compound semiconductor material;
an undoped intrinsic layer of a second Group III-V compound semiconductor material having a first bandgap energy formed on said substrate;
an undoped upper layer of a third Group III-V compound semiconductor material having a second bandgap energy which is larger than said first bandgap energy formed on said intrinsic layer, said upper layer forming a heterojunction with said intrinsic layer;
first and second contact materials disposed on the surface of said upper layer in a spaced relationship;
a first graded contact diffusion region doped with a first conductivity type impurity extending from a lower surface of said first contact material, a portion of said first graded contact diffusion region penetrating said heterojunction and extending into said intrinsic layer; and
a second graded contact diffusion region doped with a second conductivity type impurity extending from a lower surface of said second contact material, a portion of said second graded contact diffusion region penetrating said heterojunction and extending into said intrinsic layer.

2. The lateral p-i-n heterojunction device of claim 1 wherein said substrate is GaAs.

3. The lateral p-i-n heterojunction device of claim 2 wherein said intrinsic layer is GaAs and said upper layer is $Ga_{0.7}Al_{0.3}As$.

4. The lateral p-i-n heterojunction device of claim 1 wherein said substrate is InP.

5. The lateral p-i-n heterojunction device of claim 4 wherein said intrinsic layer is $Ga_{0.48}In_{0.52}As$ and said upper layer is $Al_{0.53}In_{0.47}As$.

6. The lateral p-i-n heterojunction device of claim 1 wherein said first contact material is selected from the group consisting of W(Zn) and $ZnWSi_2$.

7. The lateral p-i-n heterojunction device of claim 1 wherein said second contact material is $MoGe_2$.

8. The lateral p-i-n heterojunction device of claim 1 wherein said first contact material is selected from the group consisting of W(Zn) and $ZnWSi_2$ and the second contact material is $MoGe_2$.

9. The lateral p-i-n heterojunction device of claim 8 wherein said first conductivity type impurity is a p-type impurity and said second conductivity type impurity is an n-type impurity.

* * * * *